US007560782B2

(12) United States Patent
Pellizzer et al.

(10) Patent No.: US 7,560,782 B2
(45) Date of Patent: Jul. 14, 2009

(54) TRANSISTOR STRUCTURE WITH HIGH INPUT IMPEDANCE AND HIGH CURRENT CAPABILITY

(76) Inventors: Fabio Pellizzer, Via Peroz, 16, Follina (IT) 31051; Paolo Giuseppe Cappelletti, Corso Garibaldi, 104, Seveso (IT) 20030

( * ) Notice: Subject to any disclaimer, the term of this patent is extended or adjusted under 35 U.S.C. 154(b) by 222 days.

(21) Appl. No.: 11/605,190

(22) Filed: Nov. 27, 2006

(65) Prior Publication Data
US 2007/0126064 A1   Jun. 7, 2007

(30) Foreign Application Priority Data
Nov. 25, 2005   (EP)   ................................. 05425835

(51) Int. Cl.
*H01L 29/76* (2006.01)
(52) U.S. Cl. .................. 257/378; 257/370; 257/371; 257/E21.696; 257/E27.015
(58) Field of Classification Search ................ 257/378, 257/370, 371, E21.696, E27.015
See application file for complete search history.

(56) References Cited

U.S. PATENT DOCUMENTS 4,402,003 A * 8/1983 Blanchard .................. 257/337
5,247,200 A   9/1993 Momose et al.
5,525,826 A * 6/1996 Palara ........................ 257/378
5,541,134 A   7/1996 Eklund
5,731,617 A * 3/1998 Suda .......................... 257/370

FOREIGN PATENT DOCUMENTS

| EP | 0 310 797 A1 | 4/1989 |
| EP | 0 521 702 A1 | 1/1993 |
| JP | 01084744 | 3/1989 |

* cited by examiner

*Primary Examiner*—Andy Huynh
(74) *Attorney, Agent, or Firm*—Blakely, Sokoloff, Taylor & Zafman LLP

(57) ABSTRACT

An integrated transistor device is formed in a chip of semiconductor material having an electrical-insulation region delimiting an active area accommodating a bipolar transistor of vertical type and a MOSFET of planar type, contiguous to one another. The active area accommodates a collector region; a bipolar base region contiguous to the collector region; an emitter region within the bipolar base region; a source region, arranged at a distance from the bipolar base region; a drain region; a channel region arranged between the source region and the drain region; and a well region. The drain region and the bipolar base region are contiguous and form a common base structure shared by the bipolar transistor and the MOSFET. Thereby, the integrated transistor device has a high input impedance and is capable of driving high currents, while only requiring a small integration area.

14 Claims, 8 Drawing Sheets

TRANSISTOR STRUCTURE WITH HIGH INPUT IMPEDANCE AND HIGH CURRENT CAPABILITY

BACKGROUND OF THE INVENTION

1. Field of the Invention

The subject of the present invention is a transistor structure with high input impedance and high current capability.

Such structure can be used, for example, as a selection transistor for a phase change memory cell comprising, in addition to the selection transistor, also a phase change storage element.

2. Description of the Related Art

As is known, phase change storage elements comprise storage elements made of a class of materials having the unique property of switching in a reversible way between two phases having distinct and measurable electrical characteristics, associated to each phase. For example, these materials can switch between a disorderly amorphous phase and an orderly crystalline or polycrystalline phase. In addition, these materials can assume a plurality of states, comprised between the amorphous state and the polycrystalline state, each associated to different electrical characteristics (typically, different electrical resistances).

The materials that can advantageously be used in phase change cells are alloys of elements of group VI of the periodic table, such as Te or Se, referred to also as calcogenides or calcogenic materials. Hence, hereinafter, the term "calcogenic material" is used to designate all the materials that can be switched between at least two different phases in which they have different electrical properties (resistances) and consequently include the elements of group VI of the periodic table and their alloys.

The currently most promising calcogenide is formed by an alloy of Ge, Sb and Te ($Ge_2Sb_2Te_5$), which is already widely used for storing information in overwritable disks.

The use of phase change storage elements has been already proposed in memory arrays formed by a plurality of memory cells arranged in rows and columns. In order to prevent the memory cells from being disturbed by the noise caused by adjacent memory cells, in general each memory cell comprises a phase change storage element and a selection element, such as a MOS transistor, a bipolar transistor, or a diode.

For example, FIG. 1 shows a memory array 1 formed by a plurality of memory cells 2 arranged in rows and columns and connected to bitlines 3 (parallel to the columns of the memory array 1) and wordlines 4 (parallel to the rows of the memory array 1). Each memory cell 2 comprises a calcogenic memory element 6 and a selector element 5, here formed by a MOS transistor. Each selector element 5 has its gate region connected to the respective wordline 4, its source region connected to ground, and its drain region connected to a terminal of the calcogenic memory element 6. Each calcogenic memory element 6 is connected between the respective selection element and the respective bitline 3.

In the memory array 1, in particular operating conditions, for example during the programming step, the bitlines 3 drain high currents. The ability to drain such high currents can be met using, as selection element, a bipolar transistor with a large area. On the other hand, for optimal operation, the selection transistor should present a high input impedance, typical of MOSFETs.

This dual objective is shared also by other applications where it is desirable to have a pull-down transistor capable of driving high currents and having a high input impedance.

The need thus exists of having a transistor structure capable of combining the characteristics indicated above of bipolar and transistors MOSFETs, without requiring a large integration area.

BRIEF SUMMARY OF THE INVENTION

One embodiment of the invention is an integrated transistor device that includes an electrical-insulation region, delimiting an active area in a semiconductor chip, and a bipolar transistor and a MOSFET formed in the active area in contiguous positions. The active area accommodates a collector region; a bipolar base region contiguous to the collector region; an emitter region accommodated in the bipolar base region; a source region, arranged at a distance from the bipolar base region; a drain region; and a channel region arranged between the source and drain regions. An insulated-gate region extends on top of the active area and on top of the channel region; and the drain region and bipolar base region are contiguous and form a common base structure shared by the bipolar transistor and MOSFET.

BRIEF DESCRIPTION OF THE SEVERAL VIEWS OF THE DRAWINGS

For an understanding of the present invention preferred embodiments thereof are now described, purely by way of non-limiting example, with reference to the attached drawings, wherein.

DETAILED DESCRIPTION OF THE INVENTION

Figure 2:
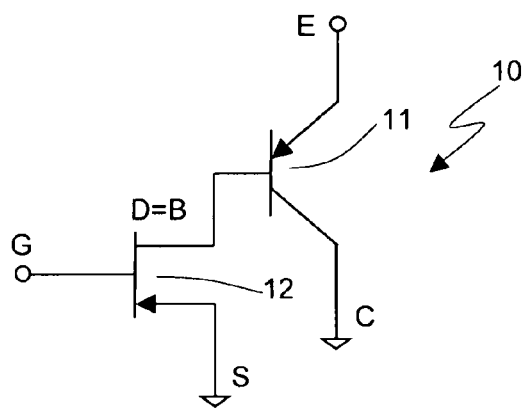
FIG. 2 shows the electrical equivalent of an N-channel pull-down transistor according to one embodiment of the invention.

In FIG. 2, a pull-down transistor 10 comprises a bipolar transistor 11 and a MOSFET 12 integrated so as to obtain a single component having two terminals accessible from the outside. In detail, the bipolar transistor 11 is a PNP transistor, and the MOSFET 12 is of N-channel type, the transistors being integrated so that the pull-down transistor 10 has two external terminals: an emitter terminal E and a gate terminal G. In addition, the pull-down transistor 10 has two regions (collector region C and source region S) connected to ground. The base region B of the bipolar transistor 11 and the drain region D of the MOSFET 12 are connected together and are formed by the same physical regions, as described in detail hereinafter.

Since the input terminal of the pull-down transistor 10 is formed by the gate terminal G of the MOSFET 12, the pull-down transistor 10 has a high input impedance. In addition, since the current-conduction terminal is the emitter terminal E and the current flows from the latter to ground mainly through the collector region C, the pull-down transistor 10 has substantially the current-driving capability of the bipolar transistor 11. These electrical characteristics are obtained with a very compact structure which can be produced using a process that is compatible with the standard CMOS process and uses only one to three more masks than the standard process, as explained hereinafter.

Figure 3:
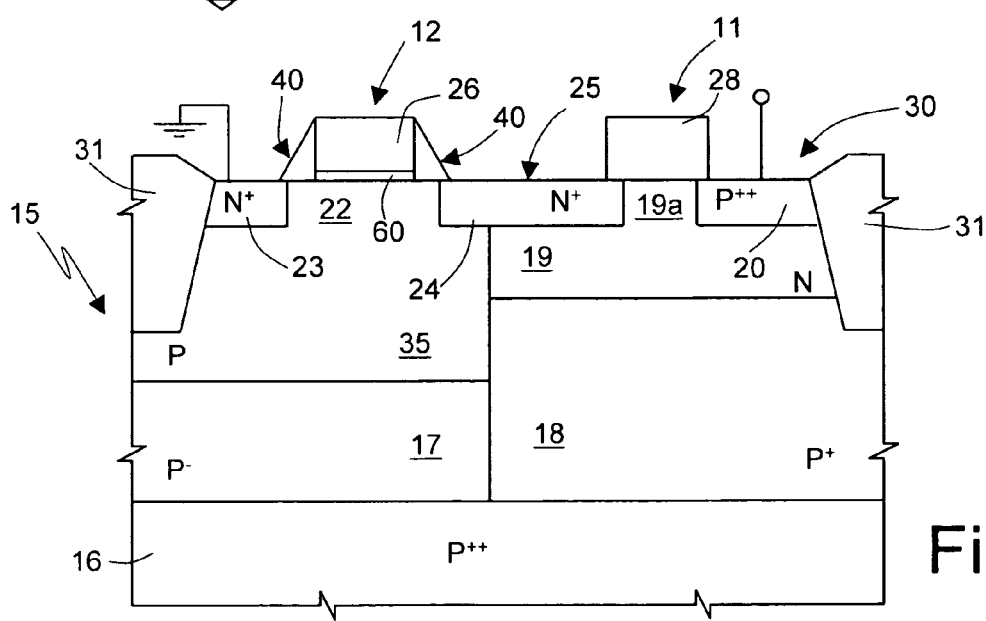
FIG. 3 shows the simplified physical structure of the pull-down transistor of FIG. 2, in cross-sectional view.

FIG. 3 is a cross-section of the simplified physical structure of the pull-down transistor 10. The bipolar transistor 11 is of vertical type and is arranged next to the MOSFET 12. The MOSFET 12, of planar type, has a drain region formed by the base region, or more precisely, by a more doped portion of the base region (equivalent to the base-contact region in standard bipolar transistors, even though here this region is not connected to any contact).

In detail, the pull-down transistor 10 of FIG. 3 is formed in an active area 30, delimited by a trench-insulation region 31 of a semiconductor body 15. The semiconductor body 15 comprises a substrate 16 of P++ type (for example, with a doping level of $10^{19}$ atoms/cm$^3$); an epitaxial region 17 of P− type (for example, with a doping level of $10^{16}$ atoms/cm$^3$), on top of the substrate 16; a collector region 18 of P+ type (for example, with a doping level of $10^{18}$ atoms/cm$^3$), next to the epitaxial region 17; a base region 19 of N+ type (for example, with a doping level of $10^{18}$ atoms/cm$^3$), on top of the collector region 18; and an emitter region 20 of P++ type (for example, with a doping level of $10^{20}$ atoms/cm$^3$), surrounded at the bottom by the base region 19 and laterally by the trench-insulation region 31 and by a surface portion 19*a* of the base region 19.

A well region 35, of P type and a doping level of approximately $10^{17}$ atoms/cm$^3$, extends on top of the epitaxial region 17, next to the base region 19 and, in part, to the collector region 18.

The well region 35 accommodates a source region 23, and, in part, a drain region 24, both of N++ type (with a doping level of $10^{20}$ atoms/cm$^3$); the drain region 24 extends also in part in the base region 19 and forms simultaneously a base-contact region.

The ensemble formed by the base region 19 and the drain region 24 thus forms a common base structure, shared by the bipolar transistor 11 and by the MOSFET 12.

The drain region 24 and source region 23 delimit a channel region 22, an insulated-gate region 26 extends on top of the channel region 22 and is separated from the surface 25 of the semiconductor body 15 by a gate-oxide region 60, and insulating spacers 40 are formed on the sides of the insulated-gate region 26. Finally, a protection region 28 extends on top of a surface portion 19*a* of the base region 19.

The source region 23 is grounded (as represented symbolically), for example through a metallization (not shown).

In the pull-down transistor 10, the physical design is structured to cause the bipolar transistor 11 to operate in forward active region with low charge injection ($J_E < 10^5$ A/cm$^2$) and thus obtain high gain and reduce the current IDS flowing through the MOSFET 12. Thereby, also the MOSFET 12 can have small dimensions, and the pull-down transistor 10 can have extremely reduced overall dimensions.

In addition, the design provides minimum resistance between the collector region 18 and the back of the wafer. In fact, in this way, a self-biasing of the collector 18 and hence triggering of the SCR rectifier formed between the emitter region 20 and the source region 23 are prevented.

In these conditions, the current that flows in the bipolar transistor 11 is supplied by the substrate 16 and can even be high. In addition, the dimensions both of the bipolar transistor 11 and of the MOSFET 12 can be one tenth of those necessary for separate components connected in series.

The structure of FIG. 3 is thus able to provide the high input impedance and current conduction capability, without requiring a large area of integration.

Consequently, the pull-down transistor 10 finds advantageous application in small memory arrays that employ high programming currents (for example, integrated fuses), since it has a much more compact structure than a single MOSFET selector and does not require a current sink for the current from the wordline, thus simplifying the design of the row decoders.

Figure 1:
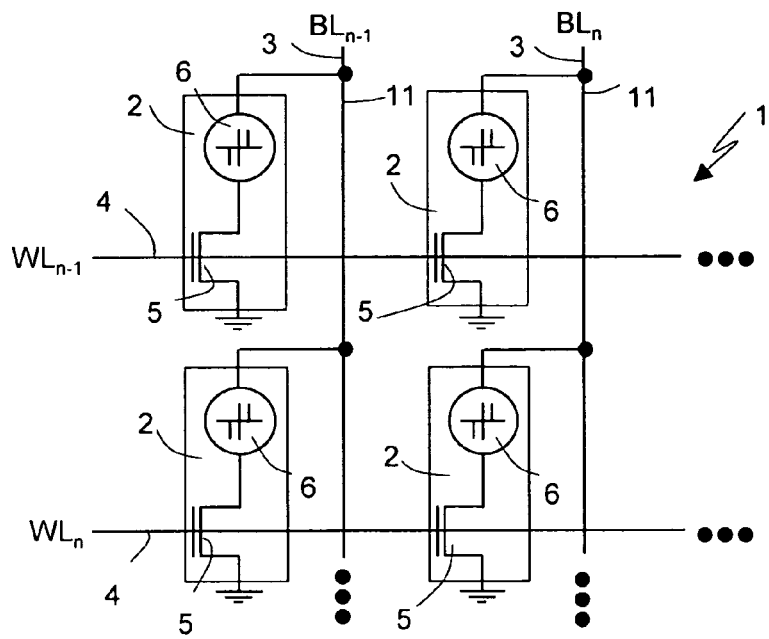
FIG. 1 shows the architecture of a phase change memory array.

In particular, the pull-down transistor 10 can be used as the selection transistor 5 in the memory array 1 of FIG. 1, or else as a leaking path for wordlines and bitlines in a compact memory array or as a pull-down transistor in generic driving circuits, by connecting a load to the emitter terminal E.

Figure 4:
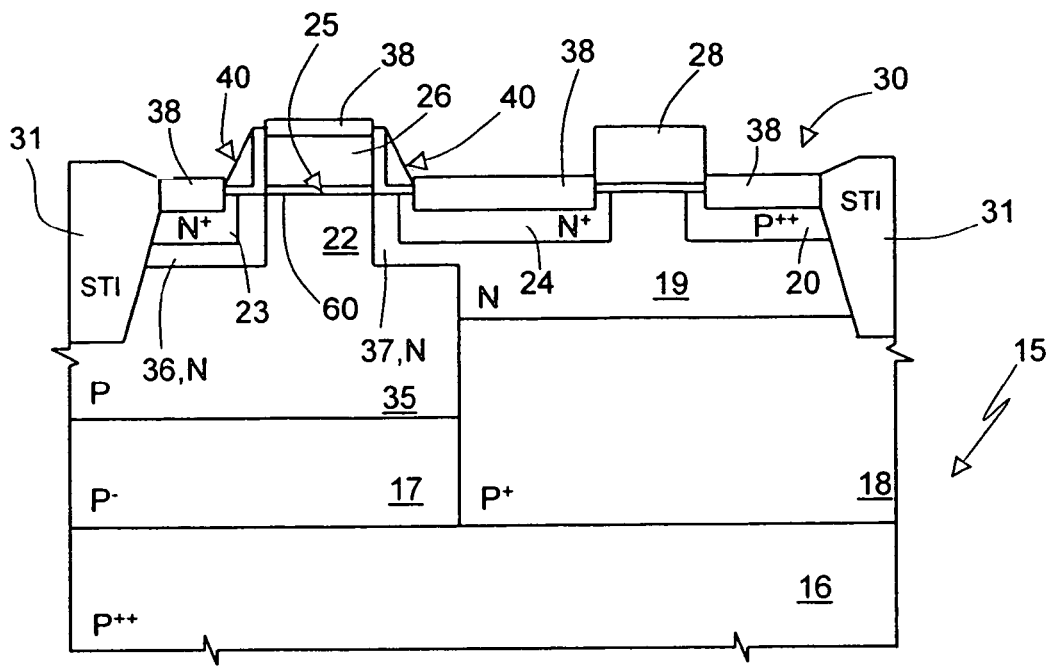
FIG. 4 shows a first embodiment of the pull-down transistor of FIG. 2, in cross-section.
Figure 5:
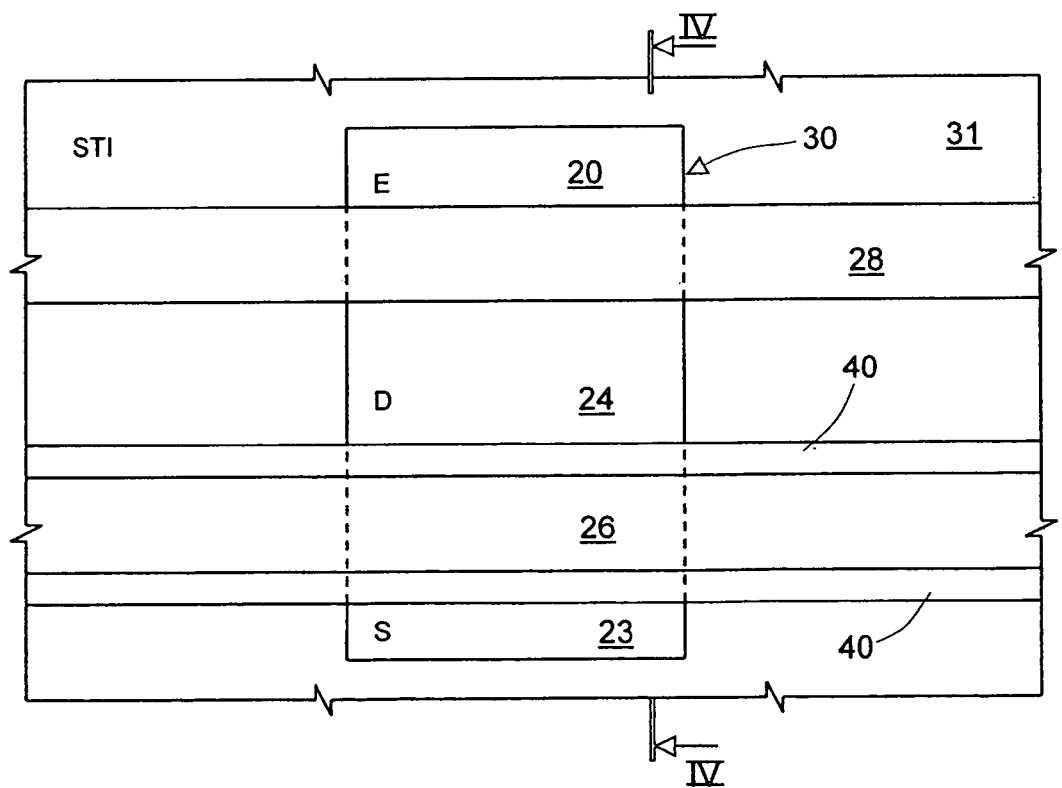
FIG. 5 is a top plan view of the embodiment of FIG. 4.

An embodiment of the pull-down transistor 10 with silicided regions is shown in FIGS. 4 and 5, wherein the parts in common with those of FIG. 3 are designated by the same reference numbers.

In detail, in FIG. 4, LDD source and drain regions 36, 37 (of an N+ type and a doping level of approximately $10^{18}$ atoms/cm$^3$) surround the respective source region 23 and drain region 24, and silicide regions 38 coat the surface of the source 23, drain 24, emitter 20, and gate 26 regions. Spacer regions 40 extend alongside the gate region 26, on top of the LDD regions 36, 37, and a gate-oxide region 60 insulates the gate region 26 from the surface 25.

As may be noted, the LDD drain region 37 is physically connected to the base region 19 and, also by virtue of the similar doping level, in practice forms a continuation of the base region 19 as far as the channel region 22. Consequently, in FIG. 4, the common base structure comprises the regions 19, 24 and 37.

FIG. 5 shows the top plan view of the structure of FIG. 4, wherein the rectangular shape of the active area 30 is clearly visible, surrounded by the trench-insulation region 31.

Figure 6:
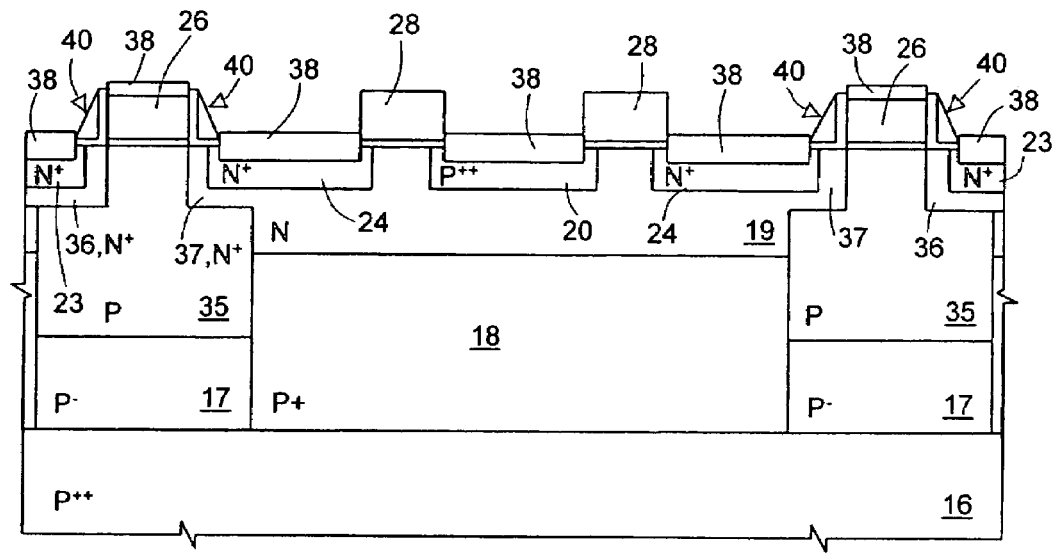
FIG. 6 shows a second embodiment of the pull-down transistor of FIG. 2, in cross-section.
Figure 7:
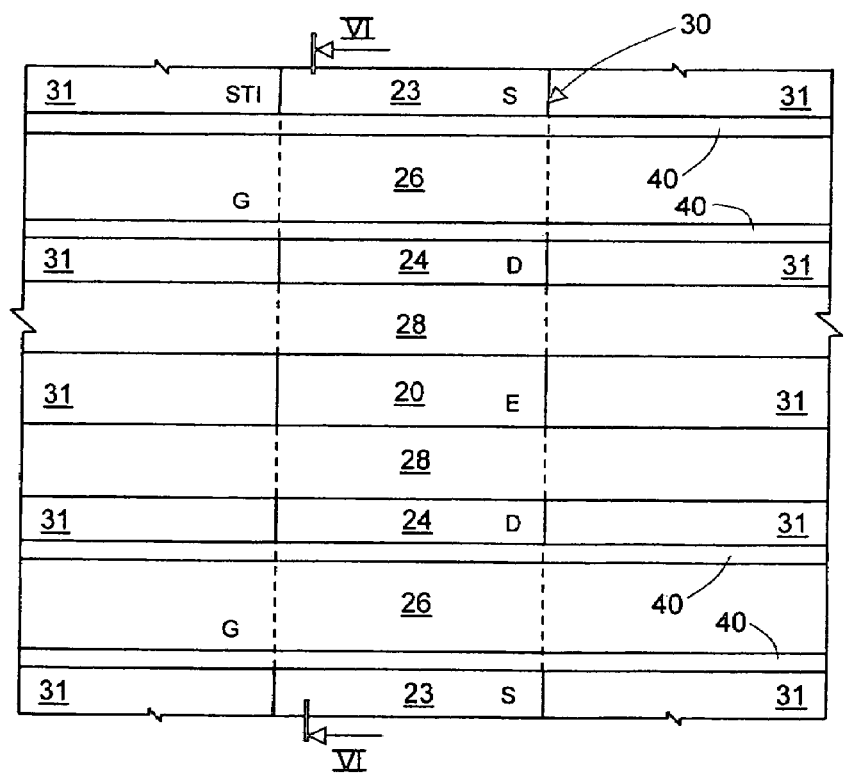
FIG. 7 is a top plan view of the embodiment of FIG. 6.

FIGS. 6 and 7 show a split-gate embodiment. Here, the active area is formed by a plurality of strips (one of which is shown) and the source 23, drain 24, and emitter 20 regions alternate within each strip. In detail, two drain regions 24 are formed within each base region 19, arranged on the two sides of the emitter region 20, and two twin MOSFETs 12 extend on the two sides of each bipolar transistor 11. With this structure, active area corners are prevented, which are always a possible source of defects.

Figure 8:
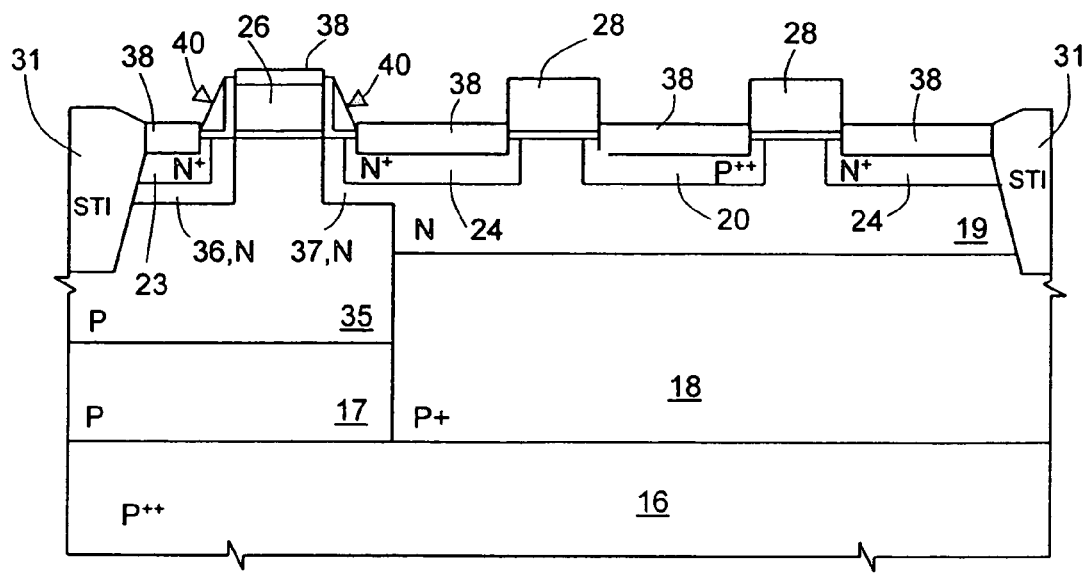
FIG. 8 shows a third embodiment of the pull-down transistor of FIG. 2, in cross-section.
Figure 9:
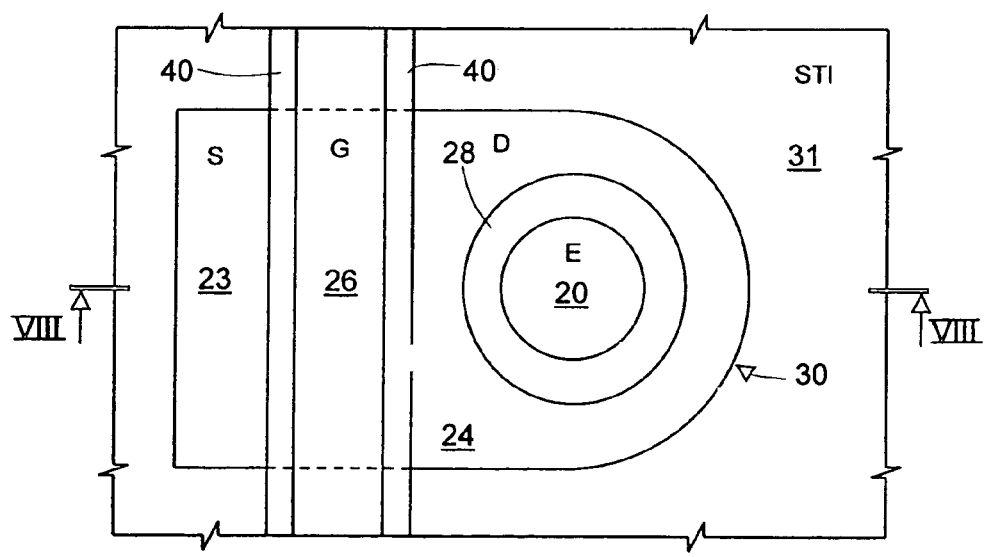
FIG. 9 is a top plan view of the embodiment of FIG. 8.
Figure 10:
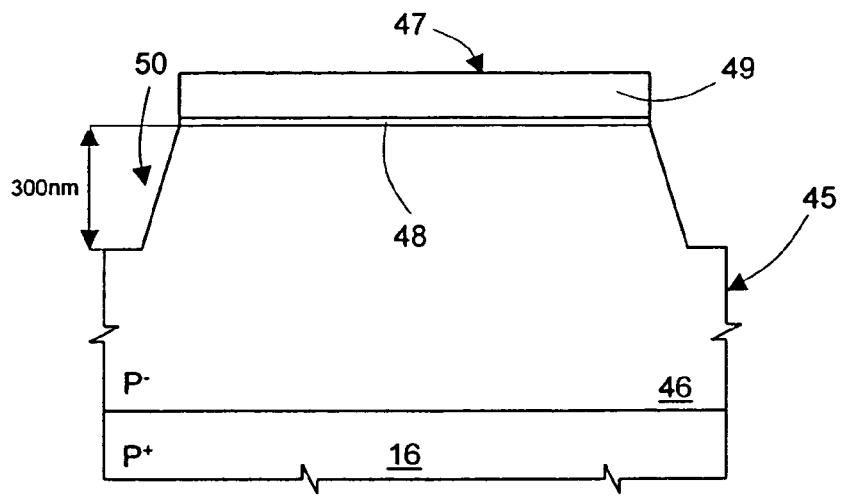
FIGS. 10-19 are cross-sections similar to FIG. 4, in successive manufacturing steps.
Figure 11:
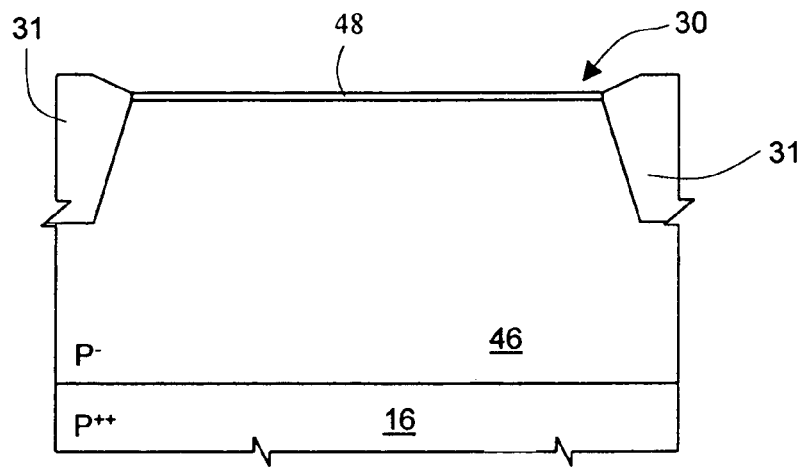

FIGS. 8 and 9 show a different embodiment, with circular emitter. In detail, as visible clearly from the top plan view of FIG. 9, the emitter region 20 has a circular shape and is surrounded at a distance by the drain region 24, which is thus approximately shaped as a circular ring (except in the portion adjacent to the gate region 26, where it has a square portion). Otherwise, the rest of the MOSFET 12 is identical to that of FIGS. 4 and 5. In this way, a structure is obtained, which is able to drive higher currents without crowding of the field lines at the corners of the emitter at the expense of a just slightly wider area. Said structure could advantageously be used, for example, in electrostatic-discharge (ESD) protection circuits.

The pull-down transistor 10 of FIGS. 4-9 is obtained in the way described hereinafter, with reference to FIGS. 10-24. In the ensuing description, specific reference will be made to the embodiment of FIGS. 4 and 5; however, the same process steps enable the structures of FIGS. 6-7 and 8-9 to be obtained, by simply modifying the shape of the masks, as is evident to a person skilled in the art.

Initially, a shallow-trench insulation (STI) is obtained. In detail (FIG. 10), on a wafer 45 of semiconductor material, formed by a substrate 16 of P++ type and by an epitaxial layer 46 of P– type, an active-area mask 47 formed by a pad-oxide layer 48 and by a silicon-nitride layer 49 is deposited and defined. Using the active-area mask 47, trenches 50 are dug for a depth of, for example, 300 nm. In particular, in the considered area, a trench 50 is dug, which surrounds a rectangular region (active area 30).

Next (FIG. 11), the trenches 50 are filled by depositing insulating material, typically oxide. Then, the structure thus obtained is planarized, for example by CMP (Chemical Mechanical Polishing), a wet etch of the projecting oxide is performed, thus forming the trench-insulation region 31, and the silicon-nitride layer 49 is removed.

Then (FIG. 12), a collector-implantation mask 53 is formed, which covers approximately half of the active area 30, a boron collector/subcollector implantation is carried out (represented schematically by the arrows 54), and a damage-recovering annealing is performed. In this way, the collector region 18 is obtained, which reaches the substrate 16. Then (FIG. 13), using the same collector-implantation mask 53, a base implantation of arsenic is performed (represented schematically by the arrows 55) to obtain the base region 19.

Figure 12:
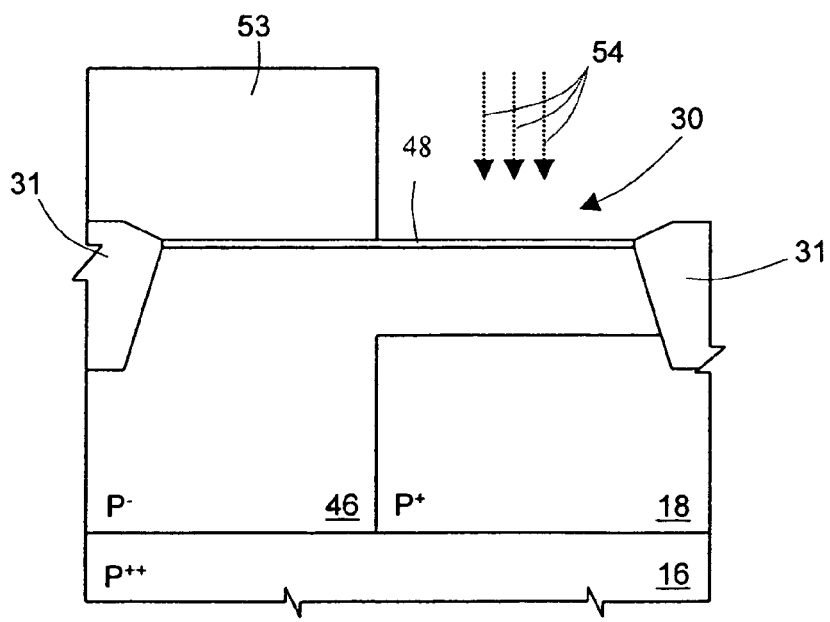
Figure 13:
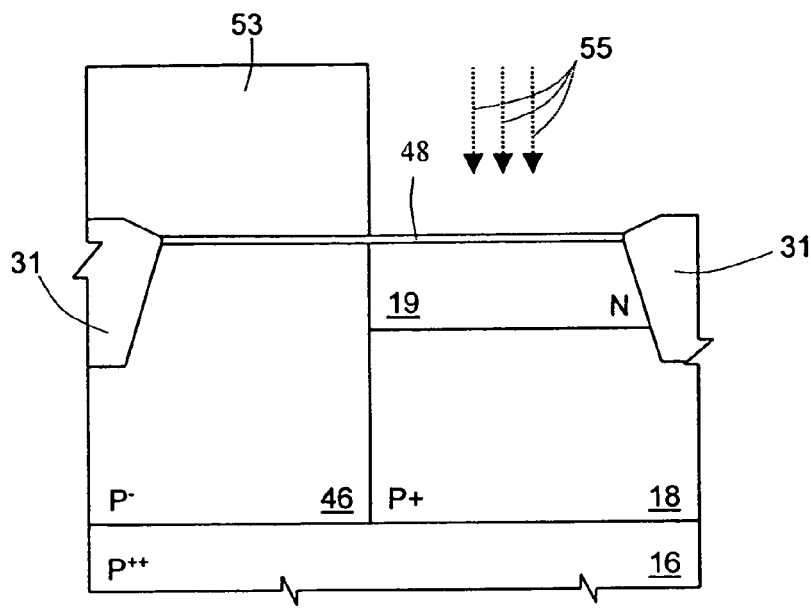
Figure 14:
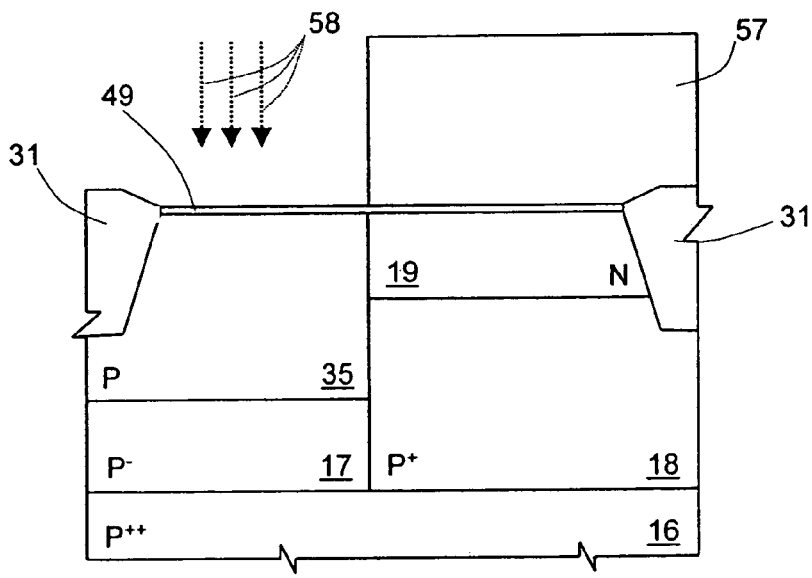
Figure 15:
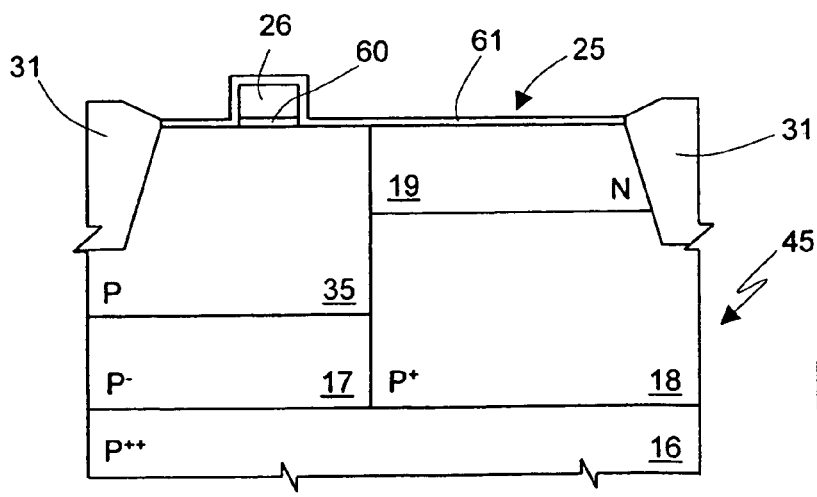
Figure 16:
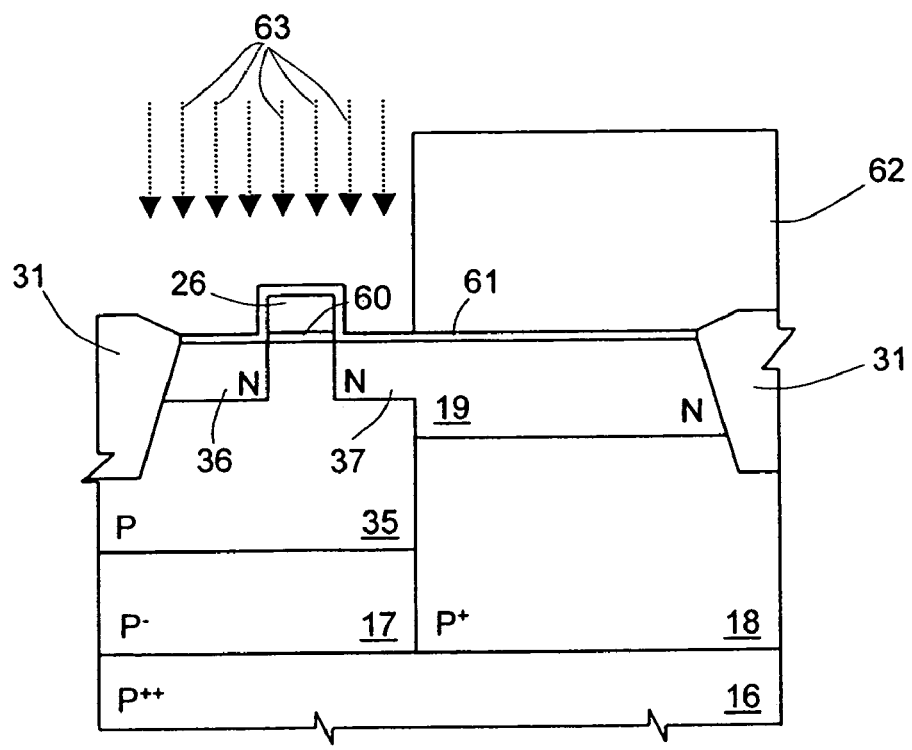
Figure 17:
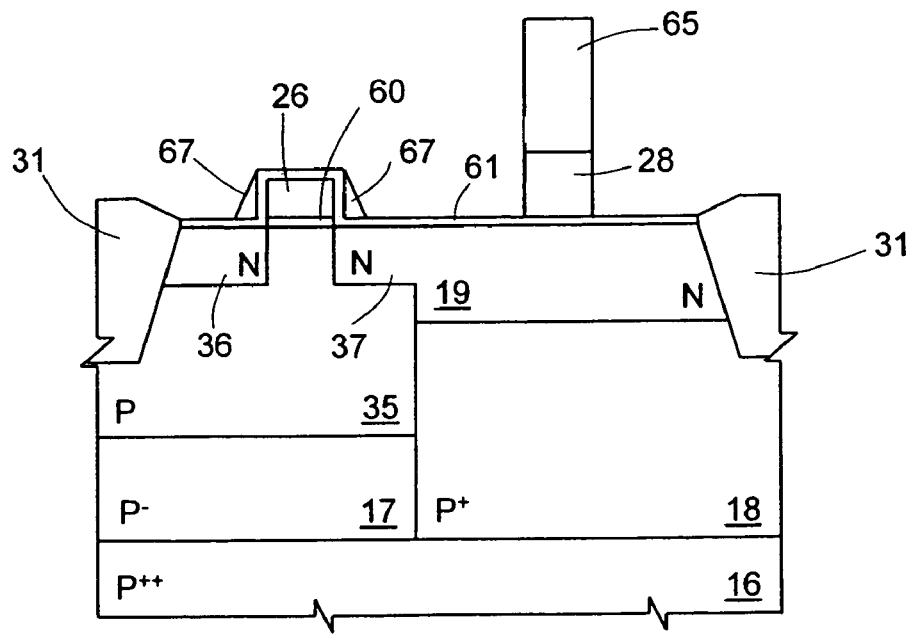
Figure 18:
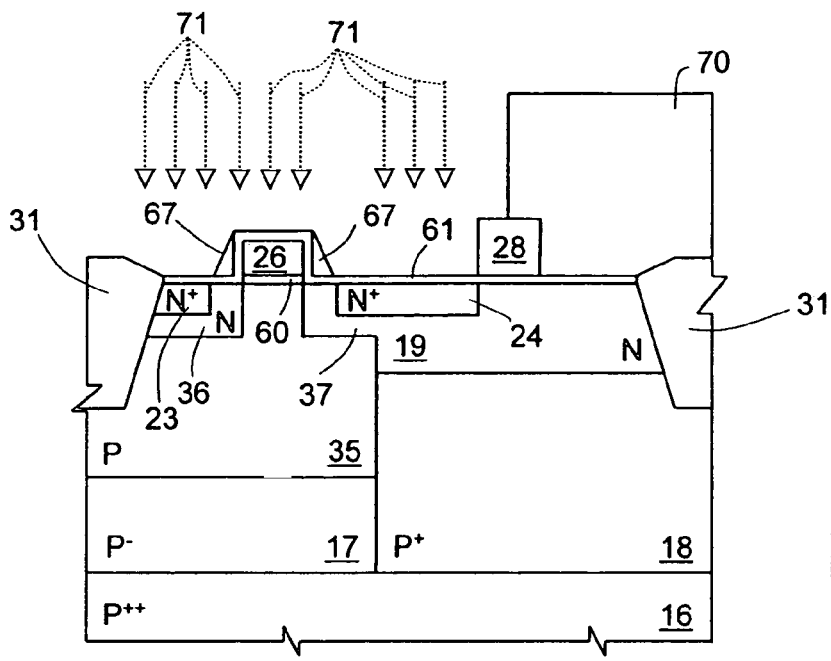
Figure 19:
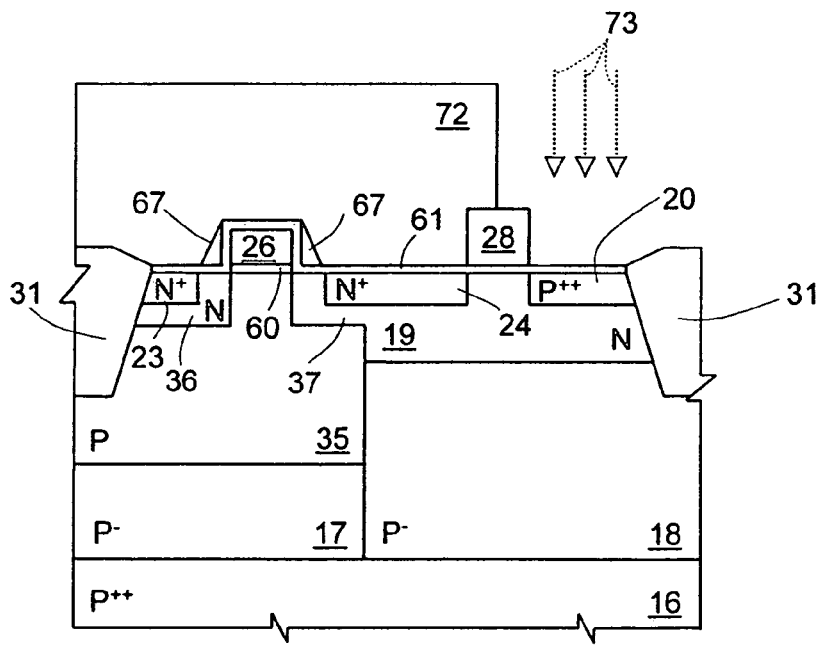

It should be noted that the collector/subcollector implantation 54 of FIG. 12 can be split into different steps (for example three) so as to obtain a higher dopant concentration in the deeper areas (in the proximity of the substrate 16), in order to reduce the resistance between the collector region 18 and the substrate 16, and so as to obtain a lower dopant concentration in the proximity of the base region 19, in order to reduce the junction leakages and the breakdown. In particular, using different steps, a vertical, gradually variable concentration may be obtained.

Then some standard CMOS steps follow to provide the N-channel and P-channel MOS transistors until the polysilicon gate regions and the LDD implant are defined. In detail, as regards the pull-down transistor 10 (see FIG. 14), a P-well mask 57 is provided and a boron implantation (represented schematically by the arrows 58) is carried out to obtain the well region 35.

It should be noted how the doping level of the P-well region 35 ($10^{17}$ atoms/cm$^3$) ensures that any misalignment of the P-well mask 57 within the base region 19 and the collector region 18 does not modify significantly the doping level of these regions. For this reason, the P-well mask 57 is preferably made so as not to completely cover the base region 19 during the P-well implantation in the area where the latter borders on the P-well region 35. Thus ensures the absence of low-doping regions between the P-well region 35 and the base region 19 (or the collector region 18) even in case of any misalignment between the respective masking levels.

Afterwards, only the epitaxial region 17 remains of the original epitaxial layer 46. Furthermore, in a way not shown, the N-well implantations are performed.

Next (FIG. 15), the insulated-gate region 26 is formed. In detail, first cleaning is carried out of the surface 25 of the wafer 45, with removal of the pad-oxide layer 48, then a gate-oxide layer 60 is grown, a polycrystalline-silicon layer 26 is deposited, the polycrystalline-silicon layer 26 and the gate-oxide layer 60 are defined, so as to form the gate region 26 and the gate-oxide region 60, and a thermal re-oxidation is performed, which leads to the formation of a protective oxide layer 61 on top and at the sides of the gate region 26 and on top of the surface 25.

Then (FIG. 16), using an LDD mask 62 that covers the bipolar area, an LDD implantation with arsenic (represented schematically by the arrows 63) is carried out, so as to obtain the LDD source and drain regions 36, 37. In particular, the LDD drain region 37 is formed contiguous to the base region 19 (thanks also to the lateral diffusion) so as to form in practice a single region with the latter, also on account of the similar doping levels of the two regions.

To this aim, preferably the LDD mask 62 does not cover completely the base region 19 in the area where the latter borders on the P-well region 35. By so doing, complete electrical connection between the LDD drain region 37 and the base region 19 is ensured even in presence of any misalignment between the respective masking levels.

At this point, the spacer forming step is modified with respect to the standard process to physically separate the emitter and base contacts of the bipolar transistor 11. In detail (FIG. 17), first a spacer layer is deposited, for example of silicon oxide, silicon nitride or a combination of these layers, an appropriate mask (protection mask 65) is formed on top of the base region 19, and the spacer layer is etched anisotropically so as to form triangular portions 67 alongside the gate region 26 as well as to form the protection region 28 underneath the protection mask 65. The same protection mask 65 can be used for other regions that must be protected by silicidation (for example, to form diffused resistors or polysilicon resistors without silicide).

Next (FIG. 18), an S/D implantation mask 70 is provided, which covers the area where the emitter region 20 is to be made, and a source/drain implant of arsenic or phosphorus is carried out (represented schematically by the arrows 71). In particular, the S/D implantation mask 70 is aligned at the center of the protection region 28 so as to obtain the maximum alignment tolerance. In this way, the source 23 and drain 24 regions are obtained. In particular, and as indicated above, the drain region 24 forms a part of the common base structure and enables reduction in the base resistance of the bipolar transistor 11. Prior to or following upon S/D implant 71, the source/drain implants can moreover be carried out for other possible PMOS transistors in the same chip.

Then (FIG. 19), an emitter-implantation mask 72 is provided, which covers the MOSFET area of the active area 30 (source 23, drain 24 and gate 26 regions) and an emitter implant of $BF_2$/boron (represented schematically by the arrows 73) is carried out. The emitter region 20 is thus obtained. It may be noted how, both during implantation of the source 23 and drain 24 regions and during implantation of the emitter region 20, the capability of the protection layer 28 for blocking these implants is advantageous.

Then, an implant activation step follows, carried out with an RTP (Rapid Thermal Process) at 900° C.-1100° C., which causes a slight diffusion of the dopants. Alternatively, a partial activation can be performed before forming the emitter-implantation mask 72, and then a separate emitter activation is performed after implantation of the emitter region 20. In both cases, after the annealing step, the surface 25 is cleaned, thereby removing the exposed portions of the protective oxide layer 61 (on top of the source 23, drain 24, emitter 20 and gate 26 regions). In this step, the remaining portions of the protective oxide layer 61 and the triangular portions 67 form the spacer regions 40 of FIG. 4. Then, silicidation of said regions is performed, via deposition of cobalt or titanium and thermal treatment, so as to form the silicide regions 38 shown in FIG. 4. The structure of FIG. 4 is thus obtained, which then is subjected to the customary final back-end steps for providing contacts, passivation, etc.

It is stressed that the protection layer 28 performs as many as three different tasks. It spaces the source 23 and well 24 regions from the gate region 26; it blocks the implantations of the source 23, well 24 and emitter 20 regions to keep them separate; finally, it resists silicidation to maintain the correct separation of the different electrical nodes of the structure.

The advantages of the integrated transistor device and of the corresponding process of manufacturing are evident from the above description.

Finally, it is clear that numerous modifications and variations can be made to the pull-down transistor and to the manufacturing process described and illustrated herein, all falling within the scope of the invention, as defined in the attached claims.

Figure 20:
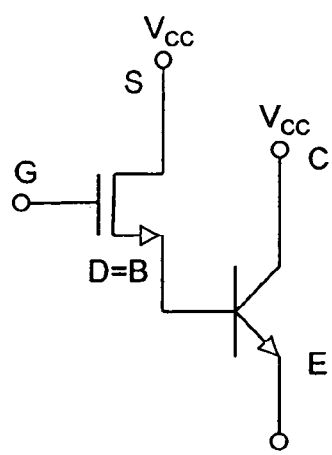
FIG. 20 shows the electrical equivalent of a P-channel transistor device according to a different embodiment of the invention.

In particular, it is stressed that the described structure can implement a transistor of a dual type, including an NPN bipolar transistor and a P-channel MOSFET and having the electrical equivalent shown in FIG. 20. As may be noted, in this case it is necessary to connect the source region to the supply voltage $V_{cc}$. In addition, in the physical implementation, it is necessary to reverse all the types of conductivity shown in FIG. 4. Furthermore, it is advantageous to use a wafer 45 having a substrate of an N type or provide for a contact from the surface 25 towards the collector region 18 to collect the current. In this way, a pull-up transistor is obtained, in which the collector C would be connected to $V_{CC}$, it being physically shorted to the N-well of the PMOS.

In addition, as regards the manufacturing process, the base implantation 55 can be performed simultaneously and using the same mask as the N-well implantation (not shown in the process illustrated in FIGS. 10-19, but present in the CMOS process). In this case, the base region would be thicker as compared to the one obtained with the described process, so that sizing would not be optimal and the efficiency of the bipolar transistor would be in part degraded. Furthermore, the STI regions (which are shallower than the drain regions) may cause insulation problems and higher risks of parasitic component activation may arise. This embodiment can consequently be used only in particular applications where, on account of the operating conditions, the voltages applied, or in general the specific conditions, the risks indicated are far from significant as compared to the advantage of a lower cost.

According to another embodiment, the emitter may be obtained during the S/D implant of the PMOS envisaged by the standard CMOS process. Also this solution enables saving one mask, and thus enables further reduction in costs, against a less optimal engineering of the emitter region.

The invention claimed is:

1. An integrated transistor device comprising:
   a chip of semiconductor material; an electrical-insulation region delimiting an active area in said chip;
   a bipolar transistor formed in said active area and including:
      a collector region;
      a bipolar base region contiguous to said collector region; and
      an emitter region accommodated in said bipolar base region; and
   a MOSFET contiguous with the bipolar transistor and including:
      a source region, arranged at a distance from said bipolar base region;
      a drain region;
      a channel region arranged between said source and drain regions; and
      an insulated-gate region that extends on top of said active area and on top of said channel region; wherein said bipolar base region is contiguous with a first side of the drain region and forms, with the drain region, a common base structure shared by said bipolar transistor and said MOSFET, wherein said common base structure comprises a LDD drain region surrounding said drain region at a bottom and on a second side thereof facing said channel region, said LDD drain region being formed as a continuation of said bipolar base region, thereby said drain region is surrounded at the first and second sides and at the bottom by said LDD drain region and said bipolar base region.

2. The integrated transistor device of claim 1, wherein said bipolar transistor is a vertical transistor, and said collector region extends underneath said bipolar base region and said emitter region.

3. The integrated transistor device of claim 1, wherein said emitter region and drain region are spaced from one another by a surface portion of said bipolar base region and a protection region of insulating material extends on top of said active area, vertically aligned to said surface portion of said bipolar base region, the protection region being thicker than a gate insulation layer that insulates the insulated-gate region from the channel region.

4. The integrated transistor device of claim 1, wherein said active area further accommodates a well region contiguous and electrically connected to said collector region.

5. The integrated transistor device of claim 4, wherein said collector region is a buried region that contacts and extends underneath the bipolar base region, the collector region and bipolar base region both contacting a same side of the well region.

6. The integrated transistor device of claim 4, wherein said chip comprises a substrate; an epitaxial region, arranged on top of said substrate and
   having a first conductivity type and a first doping level; and
      an LDD source region, surrounding said source region at the bottom and on the side thereof facing said channel region; wherein said well region is arranged on top of said epitaxial region and has said first conductivity type and a second doping level, higher than said first doping level; said LDD source and drain regions have a second conductivity type and a third doping level; said source and drain regions have said second conductivity type and a fourth doping level, higher than said third doping level; said collector region extends on top of said substrate, alongside said epitaxial region and said well region, and has said first conductivity type and a fifth doping level, higher than said first and second levels of doping; said bipolar base region extends directly on top of said collector region, next to said drain region, and has said second conductivity type and a sixth doping level, of the same order of magnitude as said third doping level; said emitter region has said first conductivity type and a seventh doping level, of the same order of magnitude as said fourth doping level.

7. The integrated transistor device of claim 6, wherein said source, drain, emitter and gate regions are silicided.

8. The integrated transistor device of claim 1, wherein said bipolar transistor is a PNP transistor and said MOSFET is an N-channel MOSFET.

9. The integrated transistor device of claim 1, wherein said integrated transistor device has a "split" gate structure, said active area having a strip shape and accommodating a further drain region formed in said common base structure, on a side of said emitter region opposite to said drain region of said integrated transistor device, said active area moreover accommodating a sequence of further MOSFETs arranged on the two sides of each bipolar transistor.

10. The integrated transistor device of claim 1, wherein said bipolar transistor is an NPN transistor and said MOSFET is a P-channel MOSFET.

11. A phase change memory array, comprising:
a plurality of memory cells arranged in rows and columns and each including a selection element and a memory element, wherein said selection element comprises an integrated transistor device that includes:
an electrical-insulation region delimiting an active area in a chip of semiconductor material;
a bipolar transistor formed in said active area and including:
a collector region;
a bipolar base region contiguous to said collector region; and
an emitter region accommodated in said bipolar base region; and
a MOSFET contiguous with the bipolar transistor and including:
a source region, arranged at a distance from said bipolar base region;
a drain region;
a channel region arranged between said source and drain regions; and
an insulated-gate region that extends on top of said active area and on top of said channel region; wherein said bipolar base region is contiguous with a first side of the drain region and forms, with the drain region, a common base structure shared by said bipolar transistor and said MOSFET, wherein said common base structure comprises a LDD drain region surrounding said drain region at a bottom and on a second side thereof facing said channel region, said LDD drain region being formed as a continuation of said bipolar base region, thereby said drain region is surrounded at the first and second sides and at the bottom by said LDD drain region and said bipolar base region.

12. The phase change memory array of claim 11, wherein said emitter region and drain region are spaced from one another by a surface portion of said bipolar base region and a protection region of insulating material extends on top of said active area, vertically aligned to said surface portion of said bipolar base region, the protection region being thicker than a gate insulation layer that insulates the insulated-gate region from the channel region.

13. The phase change memory array of claim 11, wherein said active area further accommodates a well region contiguous and electrically connected to said collector region:

14. The phase change memory array of claim 13, wherein said collector region is a buried region that contacts and extends underneath the bipolar base region, the collector region and bipolar base region both contacting a same side of the well region.

* * * * *